United States Patent
Bulumulla et al.

(10) Patent No.: US 8,674,682 B2
(45) Date of Patent: Mar. 18, 2014

(54) MONITORING SYSTEM AND CURRENT TRANSFORMERS FOR PARTIAL DISCHARGE DETECTION

(75) Inventors: Selaka Bandara Bulumulla, Niskayuna, NY (US); Jeffrey Michael Ashe, Gloversville, NY (US)

(73) Assignee: General Electric Company, Niskayuna, NY (US)

( * ) Notice: Subject to any disclaimer, the term of this patent is extended or adjusted under 35 U.S.C. 154(b) by 1204 days.

(21) Appl. No.: 12/571,105

(22) Filed: Sep. 30, 2009

(65) Prior Publication Data

US 2011/0074397 A1 Mar. 31, 2011

(51) Int. Cl.
*G01R 15/18* (2006.01)

(52) U.S. Cl.
USPC .......................................... 324/127

(58) Field of Classification Search
None
See application file for complete search history.

(56) References Cited

U.S. PATENT DOCUMENTS

| | | | |
|---|---|---|---|
| 4,581,598 A | 4/1986 | York | |
| 4,621,231 A | 11/1986 | Heinrich et al. | |
| 5,353,494 A | 10/1994 | Bisbee et al. | |
| 5,386,193 A | 1/1995 | Maeda et al. | |
| 5,583,475 A | 12/1996 | Raholijaona et al. | |
| 5,633,648 A | 5/1997 | Fischer | |
| 6,675,463 B2 | 1/2004 | Berkcan et al. | |
| 6,930,610 B2 | 8/2005 | Gao et al. | |
| 7,145,345 B2 | 12/2006 | Sarkozi et al. | |
| 2003/0206111 A1* | 11/2003 | Gao et al. ..................... | 340/635 |
| 2008/0285205 A1 | 11/2008 | Glaser et al. | |

FOREIGN PATENT DOCUMENTS

JP 04099971 A 3/1992

OTHER PUBLICATIONS

S. Ullerich et al., "Micro coils for improved power transfer in telemetry systems," 2nd Annual International IEEE-EMBS Special Topic conference on Microtechnologies in Medicine & Biology, 0-7803-7480-0/02, May 2-4, 2002.
GB1012246.3 Search Report, Oct. 30, 2010.
JP4099971 Abstract, Mar. 31, 1992.

* cited by examiner

*Primary Examiner* — Jermele M Hollington
*Assistant Examiner* — Trung Nguyen
(74) *Attorney, Agent, or Firm* — Ann M. Agosti (57) ABSTRACT

A high frequency current transformer (HFCT) sensor for detecting partial discharges produced by a component is disclosed. The HFCT sensor includes at least one electrically conductive pattern formed on a substrate, where the substrate comprises multiple segmented regions connected by intermediate regions for folding along multiple fold lines between the segmented regions to form the HFCT sensor. A system for monitoring at least one component of an aircraft wiring system is also disclosed. The monitoring system includes at least one of the HFCT sensors for detecting partial discharges produced by the aircraft wiring system component. The monitoring system further includes a data acquisition system configured to monitoring signals from the HFCT sensor(s).

21 Claims, 6 Drawing Sheets

MONITORING SYSTEM AND CURRENT TRANSFORMERS FOR PARTIAL DISCHARGE DETECTION

STATEMENT REGARDING FEDERALLY SPONSORED RESEARCH & DEVELOPMENT

This invention was made with US Government support under contract number N00421-05-D-0116-0002 awarded by Naval Air Systems Command (NavAir). The Government has certain rights in the invention.

BACKGROUND

This disclosure relates generally to systems and methods for detecting defects in aircraft wiring, and more particularly, to systems and methods for detecting partial discharges or arcing in wiring or cables.

Wiring is a critical system in aircraft, shipboard, industry and home applications. In particular, aircraft wiring integrity and safety related issues have received a great deal of interest. Aircraft wiring insulation is typically much thinner than that found in building wiring, in order to reduce weight. This thin insulation may deteriorate with age due to changes in chemical composition, vibration during flights, large temperature changes, and exposure to agents such as dust, salt, moisture and cleaning chemicals. In addition, aircraft wiring may also be exposed to mechanical stresses during maintenance. The aforementioned effects can degrade the insulation, causing cracks and chafing. These insulation defects, in turn, can cause arcing between wires or surrounding metals. Humidity together with salt and dust depositions can make the arc creation more probable.

Presently, the detection of aircraft wiring defects is primarily performed by visual inspection by maintenance personnel. This manual inspection is a slow process, and its reliability is not always satisfactory. Furthermore, as it requires twisting the wiring in order to check chafing, this visual inspection has the potential to cause problems. Therefore, a need exists for improved defect detection techniques for aircraft wiring.

As discussed for example in commonly assigned U.S. Pat. No. 6,930,610, G. Gao et al., entitled "Monitoring System and Method for Wiring Systems," which is hereby incorporated by reference, partial discharge signal detection can be used to characterize the condition of wiring. If a partial discharge occurs, the discharge will generate high frequency electrical signals traveling along the cable. This high frequency electrical signal can be detected with high frequency current transformers (HFCTs). However, commercially available current transformers are typically large and heavy and thus not suited for use in aircraft wiring monitoring as a permanently installed sensor.

Accordingly, it would be desirable to provide a relatively low weight high-bandwidth sensor suitable for use in partial discharge monitoring of aircraft wiring.

BRIEF DESCRIPTION

Briefly, one aspect of the present invention resides in a high frequency current transformer (HFCT) sensor for detecting partial discharges produced by a component. The HFCT sensor includes at least one electrically conductive pattern formed on a substrate, and the substrate comprises multiple segmented regions connected by intermediate regions for folding along multiple fold lines between the segmented regions to form the HFCT sensor.

Another aspect of the present invention resides in a system for monitoring at least one component of an aircraft wiring system. The monitoring system includes at least one high frequency current transformer (HFCT) sensor for detecting partial discharges produced by the aircraft wiring system component. The HFCT sensor includes at least one electrically conductive pattern formed on a substrate comprising multiple segmented regions connected by intermediate regions. The substrate is folded along multiple fold lines between the segmented regions to form the HFCT sensor, such that the HFCT sensor has multiple folds. The monitoring system further includes a data acquisition system configured to receive monitoring signals from the HFCT sensor(s).

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
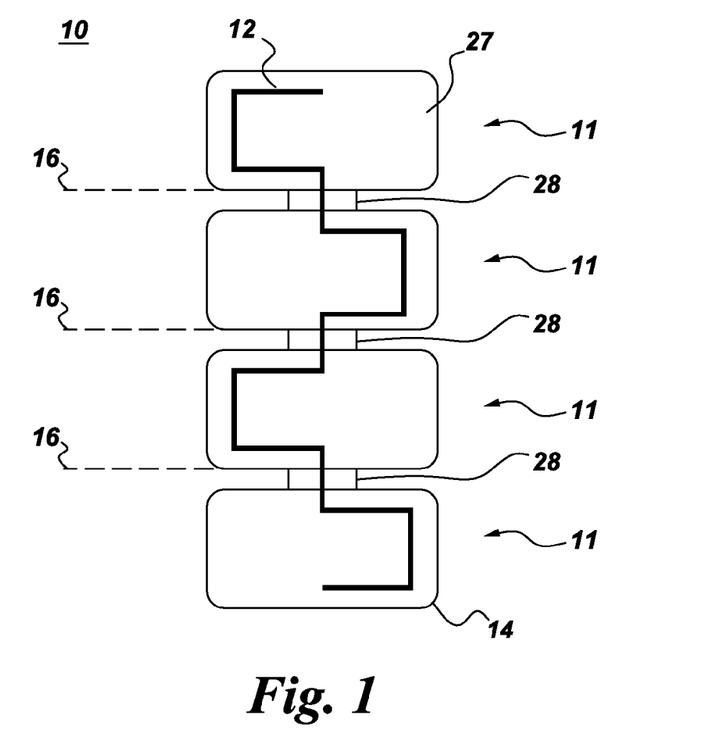
FIG. 1 illustrates an example high frequency current transformer (HFCT) sensor embodiment of the invention prior to folding.

A high frequency current transformer (HFCT) sensor 10 embodiment of the invention, for detecting partial discharges produced by a component 20, is described with reference to FIGS. 1-3. As indicated, for example, in FIG. 1, the HFCT sensor 10 includes at least one electrically conductive pattern 12 formed on a substrate 14. As indicated, for example in FIG. 1, the substrate 14 comprises a plurality of segmented regions 27 connected by intermediate regions 28 for folding along multiple fold lines 16 between said segmented regions 27 to form the HFCT sensor 10. Although the segmented regions 27 in FIG. 1 are depicted as being rectangular with rounded edges, the segmented regions may have other shapes as well. Similarly, the intermediate regions 28 need not be rectangular as shown in FIG. 1. According to a more particular embodiment, the intermediate regions 28 are narrower than the segmented regions 27 to facilitate folding. For example, a 5 mil. substrate, though flexible, can be difficult to fold. However, folding can be more easily accomplished in the narrower intermediate regions 28.

In non-limiting examples, the electrically conductive pattern 12 may be formed by depositing electrically conductive materials, such as, copper or gold, for example, on the substrate using known deposition techniques. According to a particular example, the substrate 14 comprises a flexible, electrically insulating material, non-limiting examples of which include materials marketed under the tradename Upilex® and Kapton®. Upilex® is commercially available from UBE Industries, Ltd., and Kapton® is commercially available from E. I. du Pont de Nemours and Company. Other flexible, electrically insulating materials include generic polyimide and polyethylene terephthalate (PET) materials. These materials are illustrative examples, and the invention is not limited to these specific materials. In general, low moisture absorption material, such as Upilex® and liquid crystal polymer (LCP) substrate material are desirable, as the long-term reliability is higher with such materials. For certain alternative configurations, the substrate comprises multiple materials. For example, the intermediate regions 28 may comprise a thinner, more flexible material, while the segmented regions 27 comprise a thicker, more rigid material. Similarly, a flexible substrate may be used to form the segmented and intermediate regions 27, 28, and a more rigid material may be laminated or otherwise affixed to the segmented regions 27.

Figure 2:
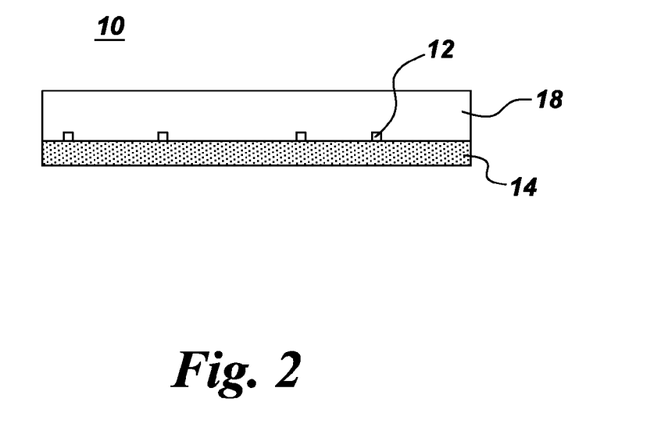
FIG. 2 depicts the HFCT sensor of FIG. 1, in partial cross-sectional view.

FIG. 2 depicts the HFCT sensor of FIG. 1, in partial cross-sectional view. For the example arrangement shown in FIG. 2, the HFCT sensor 10 further includes an encapsulating layer 18 covering the at least one electrically conductive pattern 12 and the substrate 14. Non-limiting examples of materials for encapsulating layer 18 include flexible organic polymers, such as polyimide, examples of which include materials marketed under the trade names Kapton® and Upilex®. Other exemplary flexible organic polymers include polyethersulfone (PES) from BASF, polyethyleneterephthalate (PET or polyester) from E. I. du Pont de Nemours and Company, polyethylenenaphthalate (PEN) from E. I. du Pont de Nemours and Company, and polyetherimide (PEI) from General Electric. PEI is commercially available from General Electric under the designation Ultem®.

Figure 3:
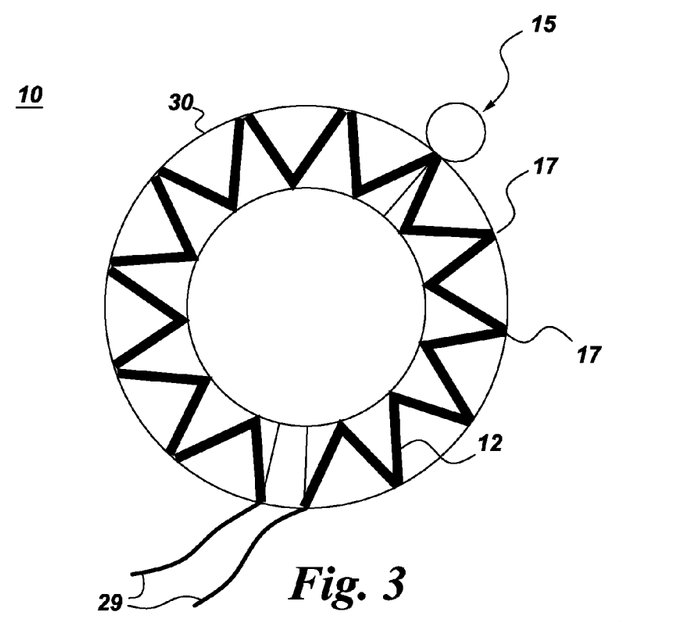
FIG. 3 schematically depicts a cross-section of an example toroidal HFCT sensor.

FIG. 3 schematically depicts a cross-section of an example toroidal HFCT sensor. As shown for example in FIG. 3, the substrate 14 is folded along the fold lines 16 (indicated in FIG. 1) to form the HFCT sensor 10, such that the HFCT sensor has a number of folds 17. More particularly, for the example arrangement depicted in FIG. 3, the substrate 14 is folded along the fold lines (schematically depicted in FIG. 1) to form a toroidal HFCT sensor 10. In the illustrated example, leads 29 are provided to connect the sensor 10 to a data acquisition system (element 40 in FIG. 9). Alternatively, the packaged sensor will have a connector (e.g. SMA, not shown) rather than leads, to facilitate the use of coaxial cables to connect the sensor to a data acquisition system.

Figure 4:
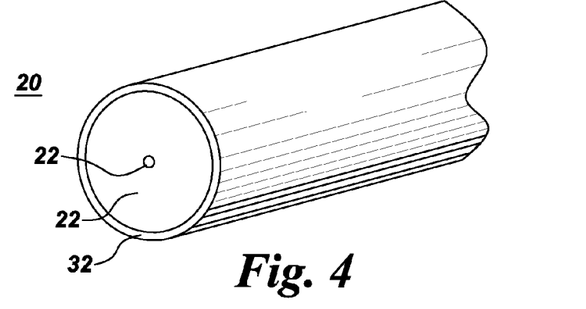
FIG. 4 schematically depicts an example wire in an aircraft wiring system.
Figure 5:
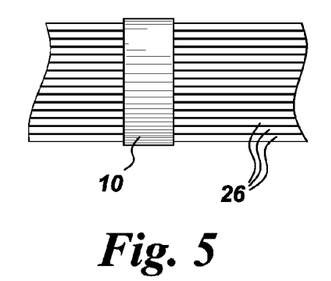
FIG. 5 schematically depicts a HFCT sensor extending around a bundle (or "harness") of wires.

As illustrated in FIGS. 4 and 5, the HFCT sensor 10 can be used to monitor single wires/cables or bundles of wires/cables, depending on the application. For the arrangement of FIG. 4, the sensor 10 is used to monitor an example wire (component) 20 in an aircraft wiring system. For this example, the component 20 comprises an electrically conductive core 22 surrounded by an electrically insulating layer 24, and wherein the HFTC sensor 10 extends around the electrically insulating layer. The component may further include a sheath, in which case the sensor 10 extends around the sheath as well. Beneficially, the single-wire/cable configuration shown in FIG. 4 facilitates quick isolation of a partial discharge indication for a specific wire/cable 20.

For the arrangement illustrated in FIG. 5, the component 20 comprises multiple wires 26. As noted above with reference to FIG. 4, each wire comprising an electrically conductive core 22 surrounded by an electrically insulating layer 24 (which is optionally surrounded by a sheath). As shown in FIG. 5, the HFTC sensor 10 extends around the bundle of wires 26. The bundle of wires is often termed a "harness." Beneficially, the bundled configuration illustrated in FIG. 5 facilitates monitoring a large number of wires.

Figure 6:
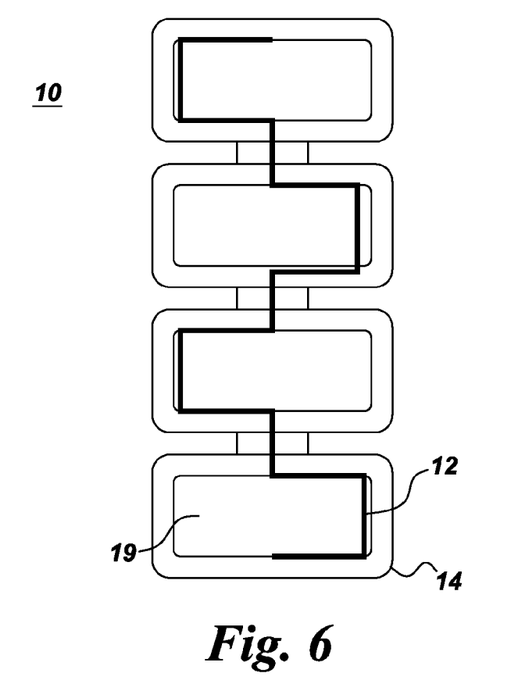
FIG. 6 shows the HFCT sensor of FIG. 1 equipped with magnetic material, in order to enhance the sensitivity of the HFCT sensor to the application of an alternating current to the HFTC sensor.

FIG. 6 shows the HFCT sensor of FIG. 1 equipped with magnetic material for enhanced sensitivity. For the configuration shown in FIG. 6, the HFCT sensor 10 further includes a magnetic material 19 configured to enhance the sensitivity of the HFCT sensor to the application of an alternating current to the at least one electrically conductive pattern 12. More particularly, the magnetic material 19 has a high magnetic permeability suitable for high frequencies. According to a particular example, the magnetic material 19 is a relatively flexible, thin, high permeability material, useable for frequencies preferably to 200 MHz. Materials such as cobalt based amorphous metal and ferrite polymer composite (FPC) films are non-limiting examples of suitable magnetic materials. In other example arrangements, non-flexible materials are employed, as the material itself does not have to be flexible since it is not used in the fold lines of the folds. An example of such material is the amorphous material family Vitrovac (e.g. VC 6030F, VC 6125F) from Vacuumshmelze, Gmbh, Germany. Other examples of suitable magnetic materials include the nanocrystalline Vitroperm material family, which is also commercially available from Vacuumshmelze, Gmbh.

Figure 7:
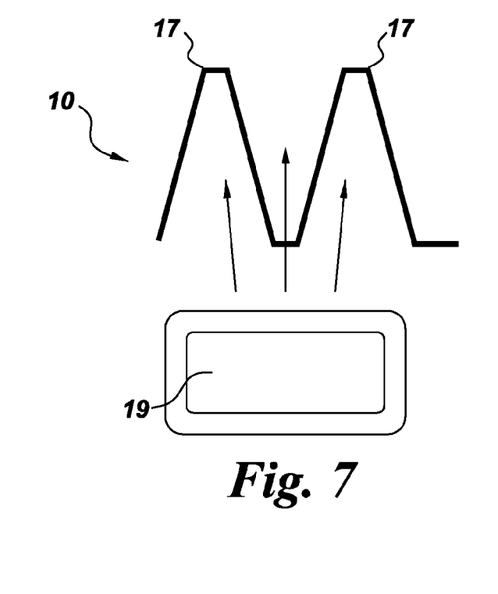
FIG. 7 illustrates the insertion of magnetic material into the folds of the HFCT sensor, in order to enhance the sensitivity of the HFCT sensor to the application of an alternating current to the HFTC sensor.

The magnetic material 19 can be introduced using a variety of configurations. For example, FIG. 7 illustrates the insertion of magnetic material between the folds of the HFCT sensor. Namely, the magnetic material 19 is inserted between neighboring gaps in the segmented regions 27. It should be noted that for this configuration the magnetic material 19 need not be inserted into each of the folds 17, and for certain embodiments, the magnetic material 19 is inserted into only a subset of the folds 17 of the substrate 14. In other arrangements, the magnetic material 19 is inserted into each of the folds 17 of the substrate 14.

For another configuration (not illustrated), the magnetic material 19 is disposed on the substrate 14. For example, the magnetic material 19 can be deposited, laminated or otherwise affixed to the flexible substrate 14. More particularly, the magnetic material 19 is disposed between the substrate 14 and the at least one electrically conductive pattern 12. In one non-limiting example arrangement, the magnetic material 19 is deposited on the segmented regions 27 but not on the intermediate regions 28.

In another arrangement, the magnetic material 19 comprises magnetic particles dispersed within at least a portion of the substrate 14. Non-limiting examples of suitable magnetic particles include Iron, Nickel and Cobalt. According to a more particular arrangement, the magnetic particles are dispersed within the segmented regions 27 of the substrate but not within the intermediate regions 28.

Figure 12:
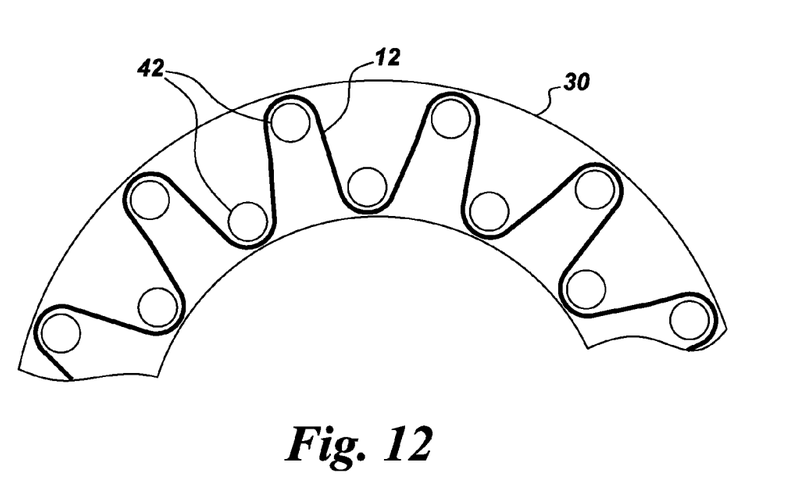
FIG. 12 illustrates a packaging arrangement for the HFTC sensor.

For the configuration shown in FIG. 3, the HFCT sensor 10 further includes a package 30 for protecting the at least one electrically conductive pattern 12 from the operating environment of the sensor. Non-limiting examples of the packaging could include Teflon, which provides structural support and protection without being overly rigid.) Another example packaging material is Nylon 6/6, which resists abrasion and repeated impact. Nylon 6/6 also resists jet fuel and hydraulic fluids, which are contaminants typically found within aircraft. FIG. 12 illustrates an example packing arrangement for the HFTC sensor. For the example arrangement, the package 30 includes a number of posts 42. As shown in FIG. 12, the substrate 12 is wound around the posts 42 to assemble the HFCT sensor 10. In one non-limiting example, the packaged sensor may be assembled using a two-piece housing 30 as follows. The posts 42 may be affixed to one piece of the housing. The flexible sensor 10 is threaded around the posts 42, and the two pieces of the housing 30 are then snapped or otherwise attached together to form the completed sensor assembly.

For the configuration shown in FIG. 3, the HFCT sensor 10 further includes at least one hinge 15 for opening and closing the HFCT sensor 10. The hinge 15 facilitates placement of the HFCT sensor 10 around the component 20 (either a single wire 26 or wire harness) to be monitored as well as removal of the HFCT sensor 10 from the component 20.

Advantageously, the HFCT sensor 10 can take the form of a single core or split-core design. For the example configurations shown in FIGS. 1 and 6, the substrate 14 comprises a number of sections 11 arranged in a row for folding along the fold lines 16 to form a single-core design.

Figure 8:
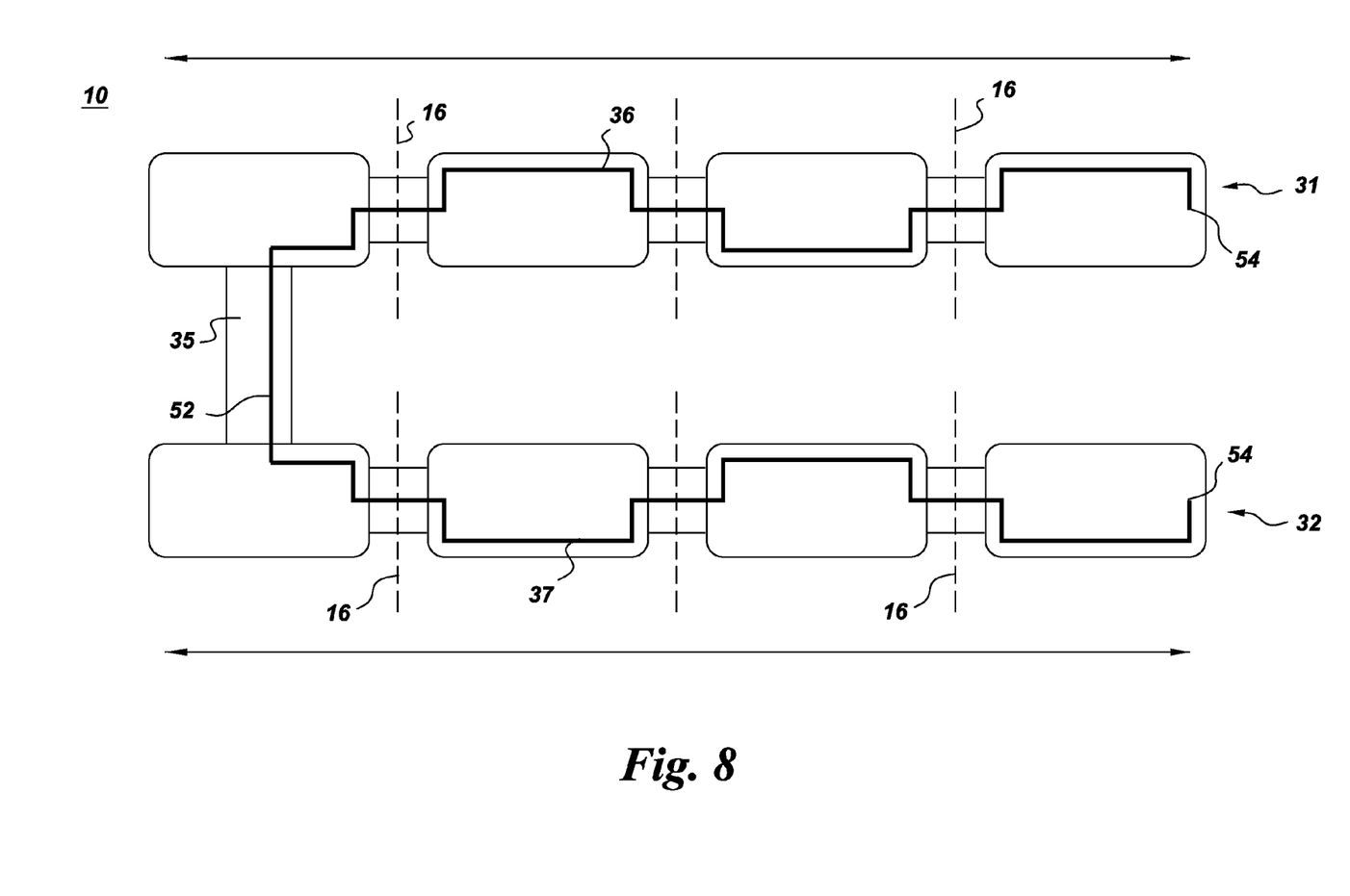
FIG. 8 illustrates a HFTC sensor with a split-core design.
Figure 10:
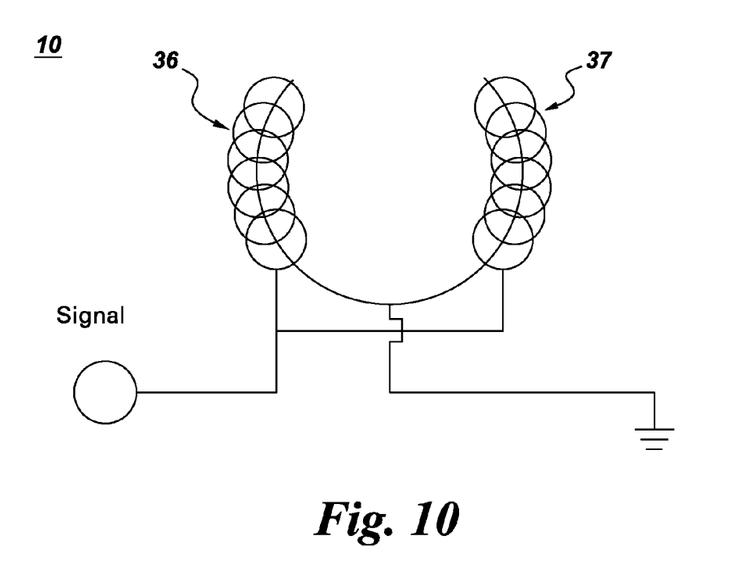
FIG. 10 illustrates the winding and counter-rotating windings for the split-core design of FIG. 8.
Figure 11:
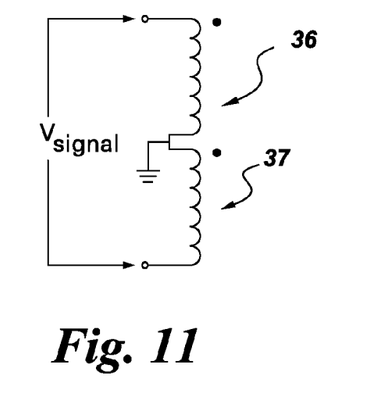
FIG. 11 illustrates the split-core design of FIGS. 8 and 10 in electrical schematic form.

FIGS. 8, 10 and 11 illustrate a HFTC sensor with a split-core design. As indicated for example, in FIG. 10, the split core design includes a rotating winding 36 and a counter-rotating winding 37. For the illustrated arrangement, one terminal is grounded to provide a ground reference signal, as indicated, for example in FIGS. 10 and 11. In addition, the respective end of each of the rotating and counter-rotating windings 36, 37 may be connected to a package shield (not shown). In one non-limiting example, the package shield comprises a metal foil arranged around the package (also not shown in FIG. 10). The package shield may be grounded by connection to an outer conductor of the cable being inspected (also not shown in FIG. 10).

The split-core design HFCT sensor 10 can be formed using the example arrangement shown in FIG. 8. As shown in FIG. 8, the substrate 14 comprises multiple sections 11 arranged in a first row 31 and a second row 32. For the illustrated arrangement, the first and second rows 31, 32 are connected by a hinge area 35 and are configured for folding along the fold lines 16 to form a split-core design. In the illustrated arrangement, the signal is captured at point 52, and reference numeral 54 indicates ground.

As discussed above with reference to FIGS. 10 and 11, the split-core design HFTC sensor 10 includes a rotating coil 36 and a counter-rotating coil 37. For the arrangement shown in FIG. 8, a portion of the one electrically conductive pattern(s) 12 is formed on the first row (31) of the substrate sections 11 to define a rotating coil (winding) 36. Similarly, another portion of the electrically conductive pattern(s) 12 is formed on the second row 33 of the substrate sections 11 to define a counter-rotating coil (winding) 37. In addition, laminated magnetic material (not shown) may be inserted between the "half" windings between the fold lines 16, similar to the arrangement discussed above with reference to FIG. 7.

Figure 9:
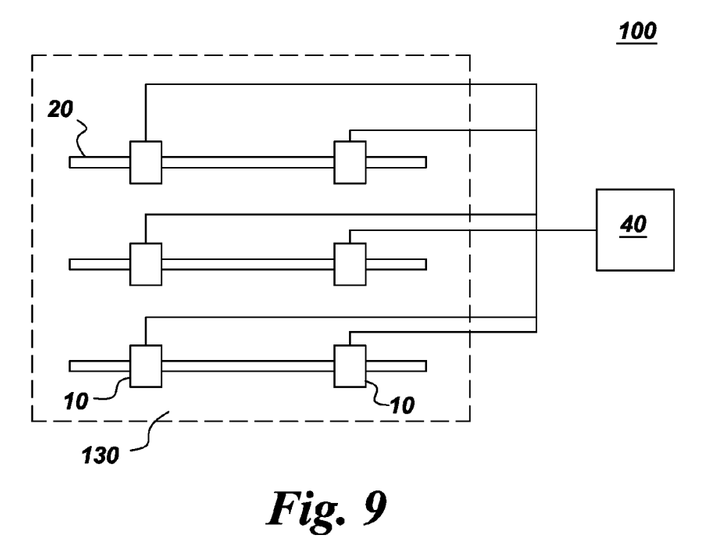
FIG. 9 depicts a monitoring system for an aircraft wiring system employing the HFCT sensors of the present invention.

A system 100 embodiment of the invention is described with reference to FIG. 9. As indicated in FIG. 9, the system 100 monitors at least one component 20 of an aircraft wiring system 130. As discussed above with reference to FIGS. 4 and 5, the component 20 may take the form of single wires/cables or bundles of wires/cables, depending on the application. As indicated in FIG. 9, the monitoring system 100 includes at least one high frequency current transformer (HFCT) sensor 10 for detecting partial discharges produced by the aircraft wiring system component 20. The HFCT sensor 10 is described above in detail. The system 100 further includes a data acquisition system 40 configured to receive monitoring signals from the HFCT sensor(s) 10. For certain embodiments, the HFCT sensor(s) 10 extends around the (respective) aircraft wiring system component 20. For particular embodiments, it is desirable to enhance the sensitivity of the HFTC sensor(s) 10. Accordingly, for these embodiments, the HFCT sensor(s) 10 further include a magnetic material 19 configured to enhance the sensitivity of the HFCT sensor(s) 10 to the application of an alternating current to the electrically conductive pattern(s) 12 in the HFCT sensor(s) 10.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A high frequency current transformer (HFCT) sensor for detecting partial discharges produced by a component, said HFCT sensor comprising at least one electrically conductive pattern formed on a substrate, said substrate comprising a plurality of segmented regions connected by intermediate regions, wherein said substrate is folded along a plurality of fold lines between said segmented regions to form said HFCT sensor, such that said HFCT sensor has a plurality of folds between said segmented regions.

2. The HFCT sensor of claim 1, further comprising an encapsulating layer covering said at least one electrically conductive pattern and said substrate.

3. The HFCT sensor of claim 1, wherein said substrate comprises a flexible, electrically insulating material.

4. The HFCT sensor of claim 1, wherein said substrate is folded along said fold lines to form a toroidal HFCT sensor.

5. The HFCT sensor of claim 1, wherein the component comprises an electrically conductive core surrounded by an electrically insulating layer, and wherein said HFTC sensor extends around the electrically insulating layer.

6. The HFCT sensor of claim 1, wherein the component comprises a plurality of wires, each wire comprising an electrically conductive core surrounded by an electrically insulating layer, wherein said HFTC sensor extends around the wires.

7. The HFCT sensor of claim 1, further comprising a magnetic material configured to enhance the sensitivity of said HFCT sensor to the application of an alternating current to said at least one electrically conductive pattern.

8. The HFCT sensor of claim 7, wherein said magnetic material is disposed within at least a subset of said segments of said substrate.

9. The HFCT sensor of claim 7, wherein said magnetic material is disposed on said substrate.

10. The HFCT sensor of claim 9, wherein said magnetic material is disposed between said substrate and said at least one electrically conductive pattern (12).

11. The HFCT sensor of claim 7, wherein said magnetic material comprises a plurality of magnetic particles dispersed within at least a portion of said substrate.

12. The HFCT sensor of claim 1, further comprising a package for protecting said at least one electrically conductive pattern from an operating environment.

13. The HFCT sensor of claim 1, further comprising at least one hinge for opening and closing said HFCT sensor in order to place said HFCT sensor around the component to be monitored and to remove said HFCT sensor from the component.

14. The HFCT sensor of claim 1, wherein said substrate comprises a plurality of sections arranged in a row for folding along said fold lines to form a single-core design.

15. The HFCT sensor of claim 1, wherein said substrate comprises a plurality of sections arranged in a first row and a second row, wherein said first and second rows are connected by a hinge area and are configured for folding along said fold lines to form a split-core design.

16. The HFCT sensor of claim 15, wherein a portion of said at least one electrically conductive pattern is formed on said first row of said substrate sections to define a rotating coil, and wherein another portion of said at least one electrically conductive pattern is formed on said second row of said substrate sections to define a counter-rotating coil.

17. A system for monitoring at least one component of an aircraft wiring system, said monitoring system comprising:
   at least one high frequency current transformer (HFCT) sensor for detecting partial discharges produced by the aircraft wiring system component, said HFCT sensor comprising at least one electrically conductive pattern formed on a substrate comprising a plurality of segmented regions connected by intermediate regions, wherein said substrate is folded along a plurality of fold lines between said segmented regions to form said HFCT sensor, such that said HFCT sensor has a plurality of folds between said segmented regions; and
   a data acquisition system configured to receive a plurality of monitoring signals from said at least one HFCT sensor.

18. The monitoring system of claim 17, wherein said at least one HFCT sensor extends around the aircraft wiring system component.

19. The monitoring system of claim 17, wherein said at least one HFCT sensor further comprises a magnetic material configured to enhance the sensitivity of said at least one HFCT sensor to the application of an alternating current to said at least one electrically conductive pattern.

20. The monitoring system of claim 17, wherein said segmented regions and intermediate regions comprise a flexible, electrically insulating material.

21. A high frequency current transformer (HFCT) sensor for detecting partial discharges produced by a component, said HFCT sensor comprising at least one electrically conductive pattern formed on a substrate, said substrate comprising a plurality of segmented regions connected by intermediate regions, wherein said substrate is folded along a plurality of fold lines between said segmented regions to form said HFCT sensor, such that said HFCT sensor has a plurality of folds between said segmented regions, wherein said intermediate regions are narrower than said segmented regions to facilitate folding.

* * * * *